US012734889B2

(12) United States Patent
Masterson et al.

(10) Patent No.: US 12,734,889 B2
(45) **Date of Patent: *Sep. 15, 2026**

(54) OPTIMIZATIONS FOR AN ELECTRIC UTILITY VEHICLE

(71) Applicant: Altec Industries, Inc., Birmingham, AL (US)

(72) Inventors: Alan Masterson, Sonora, KY (US); Marques King, Saint Joseph, MO (US); Nathan House, Vacaville, CA (US); Robert Nichols, Saint Joseph, MO (US)

(73) Assignee: Altec Industries, Inc., Birmingham, AL (US)

( * ) Notice: Subject to any disclaimer, the term of this patent is extended or adjusted under 35 U.S.C. 154(b) by 34 days.

This patent is subject to a terminal disclaimer.

(21) Appl. No.: 18/980,393

(22) Filed: Dec. 13, 2024

(65) Prior Publication Data

US 2025/0108693 A1 Apr. 3, 2025

Related U.S. Application Data

(63) Continuation of application No. 18/368,953, filed on Sep. 15, 2023, now Pat. No. 12,202,351.

(51) Int. Cl.

| | |
|---|---|
| ***B60L 1/00*** | (2006.01) |
| ***B60K 25/00*** | (2006.01) |
| ***B60L 58/00*** | (2019.01) |
| ***B60L 58/12*** | (2019.01) |
| ***B60R 16/02*** | (2006.01) |
| ***G01R 31/36*** | (2020.01) |
| ***H01M 10/48*** | (2006.01) |

(52) U.S. Cl.

CPC .............. *B60L 1/003* (2013.01); *B60K 25/00* (2013.01); *B60L 58/00* (2019.02); *B60L 58/12* (2019.02); *B60R 16/0215* (2013.01); *G01R 31/3646* (2019.01); *H01M 10/48* (2013.01); *B60L 2200/40* (2013.01); *B60L 2250/10* (2013.01); *B60L 2250/16* (2013.01); *B60L 2250/22* (2013.01); *H01M 2220/20* (2013.01)

(58) Field of Classification Search

None

See application file for complete search history.

(56) References Cited

U.S. PATENT DOCUMENTS

| | | | | |
|---|---|---|---|---|
| 2012/0242466 A1* | 9/2012 | Stillfried | ................. | B60L 58/12 340/425.5 |
| 2018/0080995 A1* | 3/2018 | Heinen | .................. | G01R 31/44 |
| 2022/0215703 A1* | 7/2022 | Coburn | .................. | B60L 50/60 |

* cited by examiner

*Primary Examiner* — Navid Z. Mehdizadeh
*Assistant Examiner* — Jason R Roberson
(74) *Attorney, Agent, or Firm* — Erise IP, P.A.

(57) ABSTRACT

Systems, methods, assemblies, and devices for monitoring and controlling a battery notification system for an electric utility vehicle. A battery level and vehicle range may be determined and monitored over time. A notification may be generated including information indicative of the battery level and vehicle range to thereby prevent electrical operations from draining the battery level below a predetermined threshold while the vehicle is parked.

20 Claims, 9 Drawing Sheets

OPTIMIZATIONS FOR AN ELECTRIC UTILITY VEHICLE

RELATED APPLICATIONS

This patent application is a continuation application claiming priority benefit, with regard to all common subject matter, of U.S. patent application Ser. No. 18/368,953, filed Sep. 15, 2023, and entitled "OPTIMIZATIONS FOR AN ELECTRIC UTILITY VEHICLE." The above referenced patent application is hereby incorporated by reference in its entirety into the present application.

BACKGROUND

1. Field

Embodiments of the present disclosure relate to utility vehicles and related systems. More specifically, embodiments of the present disclosure relate to notification systems and other devices configured to be coupled to electric utility vehicles.

2. Related Art

Electric vehicles, such as plug-in hybrid electric vehicles (PHEV), fuel cell electric vehicles (FCEV), and battery electric vehicles (BEV), have become increasingly prominent in utility applications. For example, traditional internal combustion utility trucks such as, digger derricks, aerial boom trucks, and other utility vehicles have been replaced with electrically powered counterparts. As a result of the conversion to electrical power a number of modifications are necessary. Said electric utility vehicles include large battery packs, which may be mounted in a variety of positions and produce difficulties in attaching and coupling external devices, such as a utility subbase, outrigger assembly, boom assembly, and other devices. Further, said battery packs may be sensitive to structural impact and other physical events.

Said electric utility vehicles may rely on electrical power from the battery pack to perform a variety of external and auxiliary functions. For example, the battery pack may be utilized to power an electric power take off or other device to perform operations within a work environment. As a specific example, an electric utility vehicle may be driven to a work environment and parked for long periods of time to provide utility operations such as, performing maintenance on a power line, operating a digger derrick, or other utility operations. Said utility operations may rely on battery power from the battery pack of the electric utility vehicle such that the battery level of the battery pack is drained during operation. Accordingly, a significant risk of draining the battery pack below a particular level arises. For example, the battery pack may be drained completely or beyond a level associated with a return trip of the vehicle. A typical vehicle range at full charge for an electric vehicle is around 125 miles.

SUMMARY

Embodiments of the present disclosure solve the above-mentioned problems by providing systems, methods, and devices for monitoring and controlling a battery notification system of an electric utility vehicle, as well as a structural apparatus for providing flexible mounting locations for a subbase assembly.

In some aspects, the techniques described herein relate to a notification system for an electric utility vehicle, the notification system including: a visual indicator device configured to provide a visual notification; an audible indicator device configured to provide an audible notification; a control system communicatively coupled to a vehicle system of the electric utility vehicle, the control system including at least one processor programmed to execute a method of power monitoring and notification, the method including: determining a power usage based at least in part on a power level of one or more electrical devices coupled to at least one battery of the electric utility vehicle; determining a battery level of the at least one battery of the electric utility vehicle based on at least one signal from the vehicle system; generating one or more notification signals, the one or more notification signals including: information indicative of the battery level of the at least one battery; and information indicative of a vehicle range for the electric utility vehicle, wherein the vehicle range is based at least in part on the battery level; and transmitting at least a portion of the one or more notification signals to the visual indicator device and the audible indicator device thereby causing the visual indicator device to provide a visual notification and the audible indicator device to provide an audible notification.

In some aspects, the techniques described herein relate to a notification system, wherein the method further includes: calculating a requested speed based on an operator input; determining a requested power level for the requested speed; providing electrical power at the requested power level to an electric motor coupled to a hydraulic pump; and determining a power usage based at least in part on the requested power level.

In some aspects, the techniques described herein relate to a notification system, wherein the visual indicator device includes: a plurality of LEDs configured to selectively illuminate respective to a plurality of battery levels.

In some aspects, the techniques described herein relate to a notification system, wherein at least one of the plurality of LEDs is configured to illuminate according to a flashing pattern responsive to a signal indicative of an unavailable battery level.

In some aspects, the techniques described herein relate to a notification system, wherein the visual indicator device is disposed on a utility platform of the electric utility vehicle.

In some aspects, the techniques described herein relate to a notification system, wherein the audible indicator device includes: one or more speakers disposed on the electric utility vehicle.

In some aspects, the techniques described herein relate to a notification system, further including: a communication connection coupled to the control system, the communication connection integrated with a controller area network of the vehicle system.

In some aspects, the techniques described herein relate to a method of power monitoring and notification for an electric utility vehicle, the method including: determining a power usage based at least in part on a power level of one or more electrical devices coupled to at least one battery of the electric utility vehicle; determining a battery level of the at least one battery of the electric utility vehicle based on at least one signal from a vehicle system of the electric utility vehicle; generating one or more notification signals, the one or more notification signals including: information indicative of the battery level of the at least one battery; and information indicative of a vehicle range for the electric utility vehicle, wherein the vehicle range is based at least in part on the battery level; transmitting at least a portion of the one or more notification signals to a visual indicator device and an audible indicator device thereby causing the visual indicator device to provide a visual notification and the audible indicator device to provide an audible notification; and responsive to determining that the battery level is below a predetermined threshold, disabling operation of one or more auxiliary electrical devices based on the information indicative of the battery level.

In some aspects, the techniques described herein relate to a method, further including: calculating a requested speed from an operator input; determining a requested power level for the requested speed; and providing electrical power at the requested power level to an electric motor coupled to a hydraulic pump.

In some aspects, the techniques described herein relate to a method, further including: responsive to determining that an operator is not present within a cab of the electric utility vehicle, disabling one or more electronic devices disposed in the cab of the electric utility vehicle.

In some aspects, the techniques described herein relate to a method, further including: causing for display, within a user interface associated with the electric utility vehicle, an indication of vehicle range for the electric utility vehicle and an indication of the battery level of the at least one battery.

In some aspects, the techniques described herein relate to a method, further including: causing for display, within the user interface associated with the electric utility vehicle, an indication of a current usage of the at least one battery.

In some aspects, the techniques described herein relate to a method, further including: receiving a battery level request from an operator; and responsive to the battery level request, In some aspects, the techniques described herein relate to a method, further including: responsive to a predetermined reduction in the battery level, generating a battery level update notification including information indicative of the battery level of the at least one battery.

In some aspects, the techniques described herein relate to a method of notification for an electric utility vehicle, the method including: generating one or more notification signals, the one or more notification signals including: information indicative of a battery level of at least one battery associated with the electric utility vehicle; and information indicative of a vehicle range for the electric utility vehicle, wherein the vehicle range is based at least in part on the battery level; transmitting at least a portion of the one or more notification signals to a visual indicator device and an audible indicator device thereby causing the visual indicator device to provide a visual notification and the audible indicator device to provide an audible notification; and responsive to determining that the battery level is below a predetermined threshold, disabling operation of one or more auxiliary electrical devices based on the information indicative of the battery level.

In some aspects, the techniques described herein relate to a method, further including: responsive to determining that an operator is not present within a cab of the electric utility vehicle, disabling one or more electronic devices disposed in the cab of the electric utility vehicle.

In some aspects, the techniques described herein relate to a method, further including: responsive to a predetermined reduction in the battery level, generating a battery level update notification including information indicative of the battery level of the at least one battery.

In some aspects, the techniques described herein relate to a method, further including: prior to receiving a hydraulic movement request from an operator, calculating a pressure to move for a hydraulic device associated with the electric utility vehicle to thereby decrease a hydraulic response time of the hydraulic device.

In some aspects, the techniques described herein relate to a method, further including: receiving location data from a GPS device associated with the electric utility vehicle; and determining a return range associated with a return location of the electric utility vehicle based at least in part on the location data.

In some aspects, the techniques described herein relate to a method, further including: responsive to a reduction in the battery level, generating a return range notification including information indicative of the return range.

In some aspects, the techniques described herein relate to a system for an electric utility vehicle, the system including: a subbase configured to be selectively mounted above a vehicle chassis of the electric utility vehicle and coupled to a first frame rail and a second frame rail of the vehicle chassis such that the subbase does not interfere with an internal space between the first frame rail and the second frame rail; an outrigger assembly mounted to the subbase, the outrigger assembly including: an outrigger mounting bracket mounted to the subbase, the outrigger mounting bracket including a first end protruding outwardly from the first frame rail at a first side of the vehicle chassis and a second end protruding outwardly from the second frame rail at a second side of the vehicle chassis; and a control system communicatively coupled to a vehicle system of the electric utility vehicle, the control system configured to: receive at least one signal from the vehicle system, the at least one signal including a battery level of at least one battery disposed on the electric utility vehicle.

In some aspects, the techniques described herein relate to a system, further including: a notification system including: a visual indicator device configured to provide a visual notification indicative of the battery level from the at least one signal; and an audible indicator device configured to provide an audible notification indicative of the battery level from the at least one signal.

In some aspects, the techniques described herein relate to a system, wherein the subbase includes a cutout portion configured to receive one or more cables associated with the electric utility vehicle.

In some aspects, the techniques described herein relate to a system, wherein the first end of the outrigger mounting bracket extends past the at least one battery mounted to an external surface of the first frame rail such that an outrigger cylinder of the outrigger assembly does not contact the at least one battery.

In some aspects, the techniques described herein relate to a system, wherein the first end of the outrigger mounting bracket extends past a thermal management device mounted to an external surface of the first frame rail such that an outrigger cylinder of the outrigger assembly does not contact the thermal management device.

In some aspects, the techniques described herein relate to a system, wherein the subbase includes a rigid frame configured to prevent a load from being transferred to the frame rails and the at least one battery disposed on the electric utility vehicle.

In some aspects, the techniques described herein relate to a system, wherein the control system is further configured to: calculate a requested speed from an operator input; determine a power level for the requested speed; and provide electrical power at the power level to an electric motor coupled to a hydraulic pump.

In some aspects, the techniques described herein relate to an assembly for an electric utility vehicle, the assembly including: a subbase configured to be selectively mounted above a vehicle chassis of the electric utility vehicle and coupled to a first frame rail and a second frame rail of the vehicle chassis such that the subbase does not interfere with an internal space between the first frame rail and the second frame rail; and an outrigger system including: a front outrigger assembly mounted to the subbase, the front outrigger assembly including: a front outrigger mounting bracket disposed at a front end of the subbase, the front outrigger mounting bracket including a first end protruding outwardly from the first frame rail at a first side of the vehicle chassis and a second end protruding outwardly from the second frame rail at a second side of the vehicle chassis; a first outrigger cylinder disposed at the first end of the front outrigger mounting bracket; a second outrigger cylinder disposed at the second end of the front outrigger mounting bracket; a rear outrigger assembly mounted to the subbase, the rear outrigger assembly including: a rear outrigger mounting bracket disposed at a rear end of the subbase, the rear outrigger mounting bracket including a first end protruding outwardly from the first frame rail at a first side of the vehicle chassis and a second end protruding outwardly from the second frame rail at a second side of the vehicle chassis; a third outrigger cylinder disposed at the first end of the rear outrigger mounting bracket; and a fourth outrigger cylinder disposed at the second end of the rear outrigger mounting bracket.

In some aspects, the techniques described herein relate to an assembly, further including: a control system communicatively coupled to a vehicle system of the electric utility vehicle, the control system configured to: receive at least one signal from the vehicle system, the at least one signal including a battery level of at least one battery disposed on the electric utility vehicle.

In some aspects, the techniques described herein relate to an assembly, further including: a notification system including: a visual indicator device configured to provide a visual notification indicative of the battery level from the at least one signal; and an audible indicator device configured to provide an audible notification indicative of the battery level from the at least one signal.

In some aspects, the techniques described herein relate to an assembly, wherein the subbase is secured to the vehicle chassis via a first attachment assembly attached around the first frame rail and a second attachment assembly attached around the second frame rail.

In some aspects, the techniques described herein relate to an assembly, further including: a plurality of slide pads disposed on a bottom surface of the subbase.

In some aspects, the techniques described herein relate to an assembly, wherein the first end of the rear outrigger mounting bracket extends past a battery mounted to an external surface of the first frame rail such that the first outrigger cylinder does not contact the battery.

In some aspects, the techniques described herein relate to an assembly, wherein each of the first outrigger cylinder, the second outrigger cylinder, the third outrigger cylinder, and the fourth outrigger cylinder are configured to protrude up through a top surface of the respective outrigger mounting bracket when in a stowed position.

In some aspects, the techniques described herein relate to a system for an electric utility vehicle, the system including: a subbase configured to be selectively mounted above a vehicle chassis of the electric utility vehicle and coupled to a first frame rail and a second frame rail of the vehicle chassis such that the subbase does not interfere with an internal space between the first frame rail and the second frame rail; a control system communicatively coupled to a vehicle system of the electric utility vehicle, the control system configured to: receive at least one signal from the vehicle system, the at least one signal including a battery level of at least one battery disposed on the electric utility vehicle; and a notification system including: a visual indicator device configured to provide a visual notification indicative of the battery level from the at least one signal; and an audible indicator device configured to provide an audible notification indicative of the battery level from the at least one signal.

In some aspects, the techniques described herein relate to a system, further including: an outrigger assembly mounted to the subbase, the outrigger assembly including an outrigger mounting bracket mounted to the subbase, the outrigger mounting bracket including a first end protruding outwardly from the first frame rail at a first side of the vehicle chassis and a second end protruding outwardly from the second frame rail at a second side of the vehicle chassis.

In some aspects, the techniques described herein relate to a system, further including: a plurality of cables disposed along an outside surface of the first frame rail, the plurality of cables including: one or more electrical cables coupled to the at least one battery; and one or more hydraulic lines coupled to a hydraulic pump associated with the electric utility vehicle.

In some aspects, the techniques described herein relate to a system, wherein the visual indicator device includes: a plurality of LEDs configured to selectively illuminate respective to a plurality of battery levels.

In some aspects, the techniques described herein relate to a system, wherein the visual indicator device is disposed on a utility platform of the electric utility vehicle.

In some aspects, the techniques described herein relate to a system, wherein the audible indicator device includes: one or more speakers disposed on the electric utility vehicle.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present disclosure will be apparent from the following detailed description of the embodiments and the accompanying drawing figures.

BRIEF DESCRIPTION OF THE DRAWING FIGURES

Embodiments of the present disclosure are described in detail below with reference to the attached drawing figures, wherein.

Figure 1:
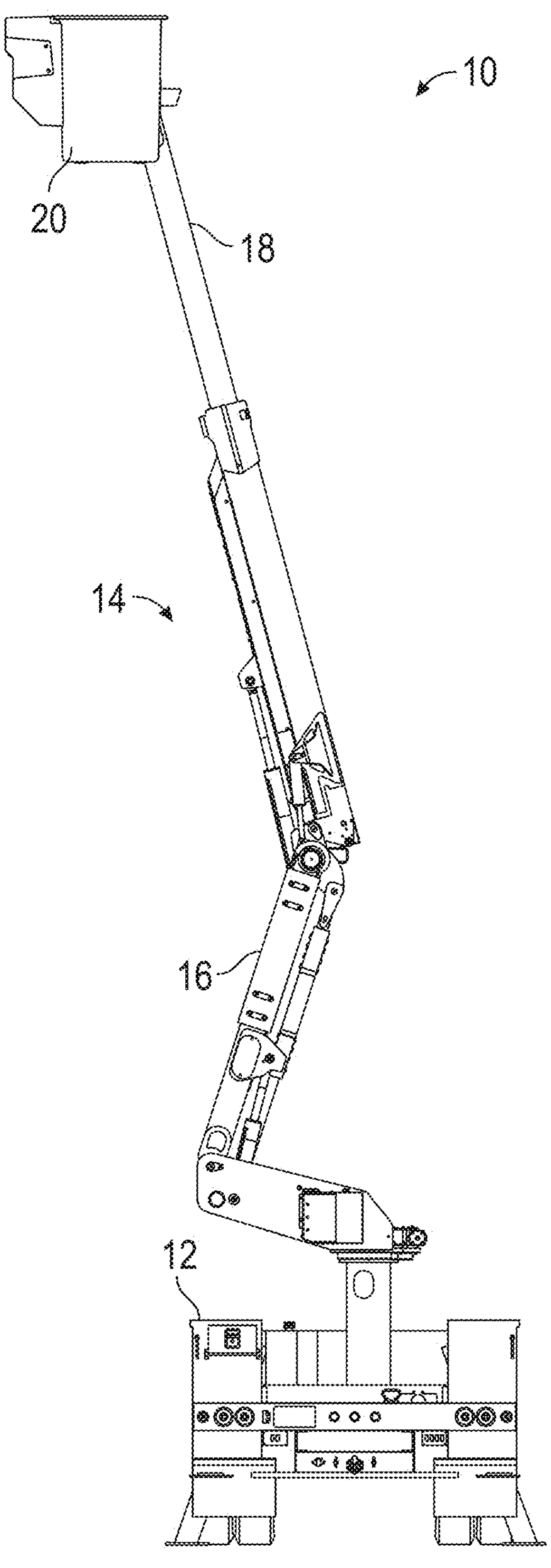
FIG. 1 illustrates an exemplary aerial device relating to some embodiments of the present disclosure.

The drawing figures do not limit the present disclosure to the specific embodiments disclosed and described herein. The drawings are not necessarily to scale, emphasis instead being placed upon clearly illustrating the principles of the present disclosure.

DETAILED DESCRIPTION

The following detailed description references the accompanying drawings that illustrate specific embodiments in which the present disclosure can be practiced. The embodiments are intended to describe aspects of the present disclosure in sufficient detail to enable those skilled in the art to practice the present disclosure. Other embodiments can be utilized and changes can be made without departing from the scope of the present disclosure. The following detailed description is, therefore, not to be taken in a limiting sense. The scope of the present disclosure is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Structural Design

FIG. 1 illustrates an exemplary aerial device 10 relating to some embodiments of the present disclosure. The aerial device 10, may be attached to a utility vehicle 12, as shown. The utility vehicle 12 may comprise an electric utility vehicle comprising at least one battery for powering portions of the utility vehicle and one or more external devices. The aerial device 10 comprises a boom assembly 14 including a proximal end 16 and a distal end 18, and an aerial work platform 20 supported at the distal end 18. In some embodiments, various components of the aerial device 10 may have electrically insulating properties, such as portions of the boom assembly 14 at the proximal end 16 and distal end 18, and the aerial work platform 20. For example, said components may be composed of an electrically insulating material such as fiberglass. Additionally, in some embodiments, components of the aerial device 10 may be electrically conductive, such as a boom tip of the boom assembly 14 at the distal end 18.

Figure 2A:
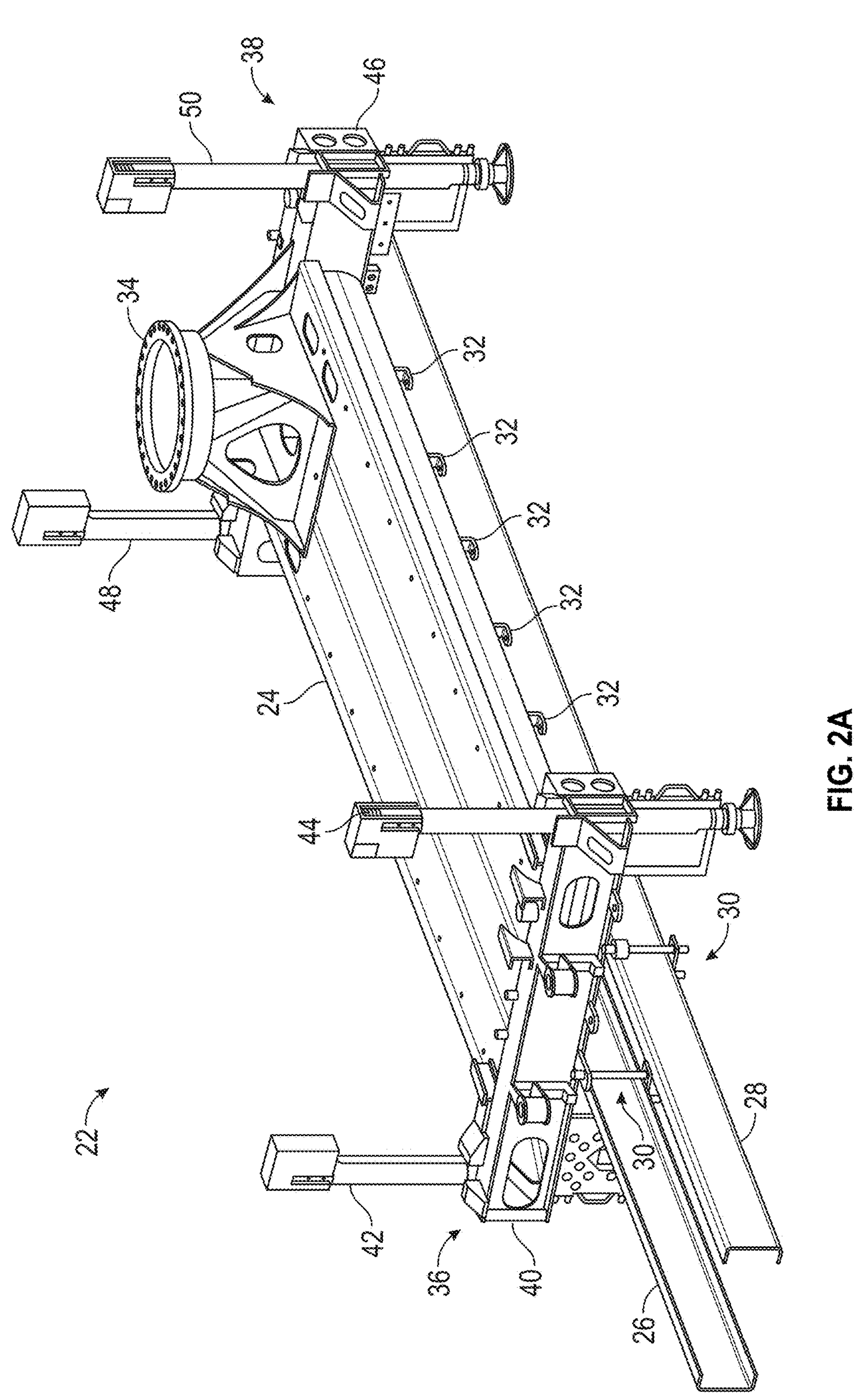
FIG. 2A illustrates an exemplary subbase assembly relating to some embodiments of the present disclosure.

FIG. 2A illustrates an exemplary subbase assembly 22 relating to some embodiments of the present disclosure. The subbase assembly 22 may be coupled to one or more frame rails of a vehicle chassis. For example, a subbase frame 24 may be mounted to a first frame rail 26 and a second frame rail 28. In some embodiments, the subbase frame 24 may be mounted to the frame rails via a plurality of attachment assemblies 30, as shown. For example, in some embodiments, four clamp assemblies may be included such as a first attachment assembly disposed at a front portion of the first frame rail 26 and a second attachment assembly disposed at the front portion of the second frame rail 28, a third attachment assembly disposed at the rear portion of the first frame rail 26, and a fourth attachment assembly disposed at the rear portion of the second frame rail 28.

In some embodiments, one or more slide pads 32 are included on a bottom surface of the subbase frame 24 configured to contact a top surface of the frame rails 26 and 28. The slide pads 32 may be operable to allow the subbase frame 24 to slide across the frame rails 26, 28, such that the mounting position of the subbase frame 24 may be selectively adjusted. For example, the subbase frame 24 may be positioned such that one or more batteries mounted to the vehicle frame are accessible. Accordingly, the subbase frame 24 is compatible with a variety of different types of vehicle frames with varying battery mounting positions.

In some embodiments, a utility turntable 34 may be mounted or otherwise integrated into the subbase frame 24, as shown. Alternatively, in some embodiments, the utility turntable 34 may be mounted directly to the frame rails. The utility turntable 34 is coupled to a proximal end of a utility boom or other utility device.

In some embodiments, one or more outrigger assemblies may be included, for example, a front outrigger assembly 36 and a rear outrigger assembly 38 disposed at a front end of the subbase frame 24 and a rear end of the subbase frame 24 respectively, as shown. The front outrigger assembly 36 includes a front outrigger mounting bracket 40 with a first outrigger cylinder 42 disposed at a first end of the front outrigger mounting bracket 40 and a second outrigger cylinder 44 disposed at a second end of the front outrigger mounting bracket 40. The rear outrigger assembly 38 includes a rear outrigger mounting bracket 46 with a third outrigger cylinder 48 disposed at a first end of the rear outrigger mounting bracket 46 and a fourth outrigger cylinder 50 disposed at a second end of the rear outrigger mounting bracket 46.

In some embodiments, the subbase assembly 22 may be adapted to be coupled to a vehicle chassis of an electric vehicle, such as, for example any of a plug-in hybrid electric vehicle (PHEV), fuel cell electric vehicle (FCEV), or battery electric vehicle (BEV), as well as other forms of vehicles propelled by an electric drivetrain. Accordingly, the structure of the subbase assembly 22 and outrigger assemblies may be modified to allow coupling with the electric vehicle. For example, the subbase frame 24 may be mounted above the frame rails 26 and 28, as shown, to prevent interference with internal space between the first frame rail 26 and second frame rail 28, a potential mounting location for a vehicle battery of the electric vehicle. Such a configuration of disposing the subframe assembly 22 above the frame rails using the clamp assemblies 30 prevents more intrusive fastening methods such as bolting through the sides of the frame rails, which poses a significant risk to batteries disposed between the frame rails. Further, in some embodiments, the outrigger assemblies may be configured to extend outward from the vehicle frame to allow space for mounting one or more batteries or other related components on an outside surface of the frame rails.

In some embodiments, the subbase frame 24 may comprise a structural configuration and/or a rigid material that prevents a load from being transferred to the frame rails. For example, the subbase assembly 22 may experience torsional loading during operation or transport and the rigidity of the subbase frame 24 prevents said torsional loading from affecting the vehicle chassis, frame rails, and batteries or other sensitive components disposed therein or thereon.

Figure 2B:
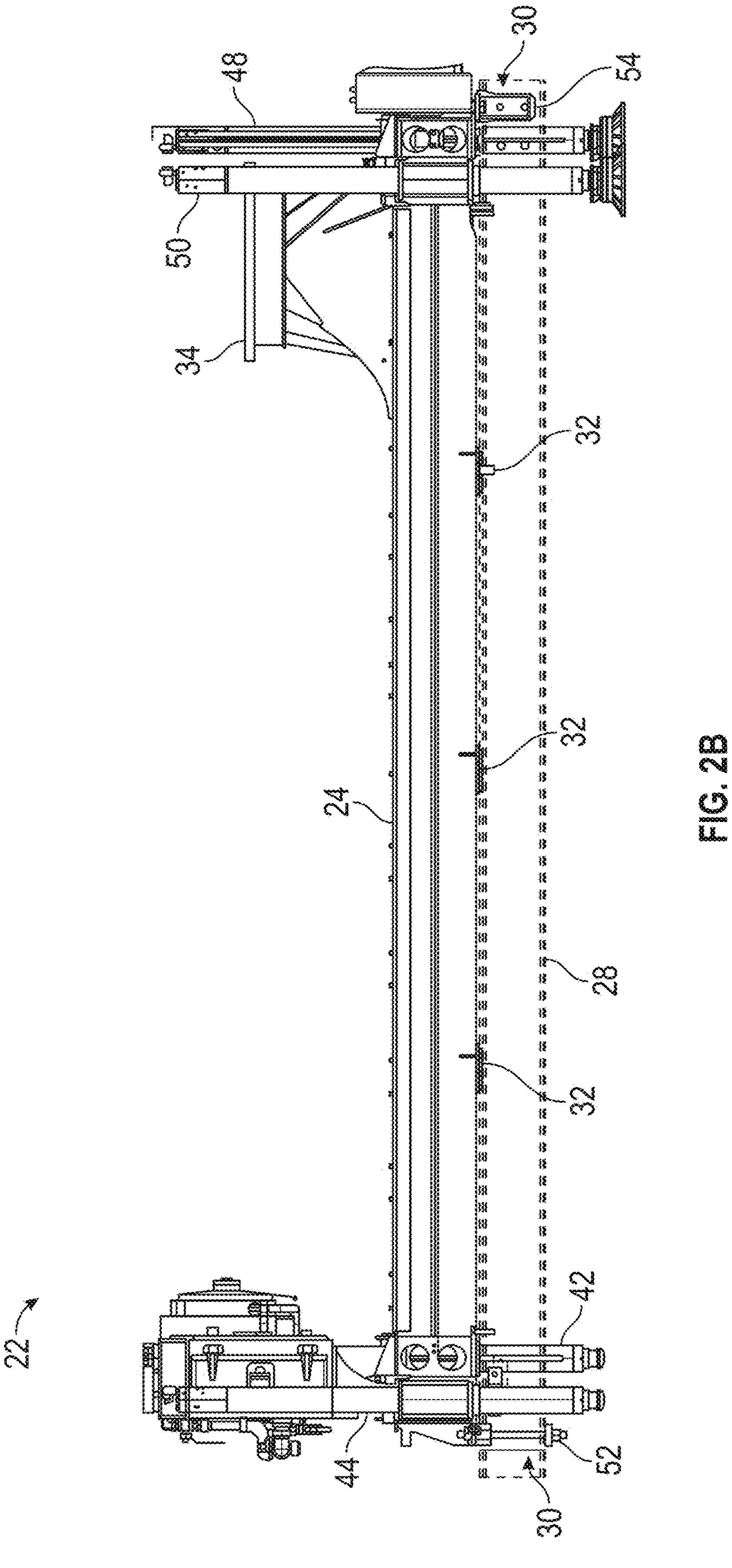
FIG. 2B illustrates a side view of the exemplary subbase assembly relating to some embodiments of the present disclosure.

FIG. 2B illustrates a side view of the exemplary subbase assembly 22 relating to some embodiments of the present disclosure. As described above, the subbase assembly 22 comprises the subbase frame 24, first frame rail 26, second frame rail 28, plurality of attachment assemblies 30, one or more slide pads 32, utility turntable 34, front outrigger assembly 36, rear outrigger assembly 38, front outrigger mounting bracket 40, first outrigger cylinder 42, second outrigger cylinder 44, rear outrigger mounting bracket 46, third outrigger cylinder 48, and fourth outrigger cylinder 50.

In some embodiments, the slide pads 32 are disposed along a length of the subbase frame 24, as shown, along the bottom surface of the subbase frame 24 such that the subbase frame 24 supported by the slide pads 32 may be slid across a top surface of the second frame rail 28.

In some embodiments, one or more types of attachment assemblies 30 are included. For example, a first attachment assembly may comprise an adjustable clamp 52 configured to clamp around a portion of the frame rails and a second attachment assembly may comprise a mounting plate 54 bolted to the frame rails, as shown. The adjustable clamp 52 may comprise a tie rod configured to clamp around the frame rail to thereby secure the subbase frame 24 to the frame rails 26, 28. In some embodiments, a combination of distinct types of attachment assemblies are used. However, embodiments are contemplated in which a single type of attachment assembly is used. For example, in some embodiments, only clamp-based attachment assemblies are used.

In some embodiments, the adjustable clamp 52 comprises a threaded rod configured to be coupled to one or more nuts. Accordingly, the clamp 52 may be adjusted by loosening or tightening the nuts disposed around the threaded rod. The mounting plate 54 comprises a plate configured to be disposed on a surface of one of the frame rails 26 and 28. The plate comprises one or more holes configured to receive bolts to thereby secure the mounting plate 54 to the respective frame rail. In some embodiments, any of the adjustable clamp 52 and the mounting plate 54 may be selectively removable and adjustable for example, such that the subbase frame 24 may be removed from the frame rails 26 and 28 for maintenance and/or replacement.

In some embodiments, one or more cables, hydraulic hoses, or other lines may be routed along a side of the frame rails 26 and 28. Alternatively, in some embodiments, said lines may be routed through at least a portion of the subbase assembly 22. For example, one or more holes may be included in the subbase frame 24 such that lines may be routed through the subbase without interfering with a battery mounting location. Further, the above described subbase assembly 22 is operable to accommodate a variety of different mounting locations for an at least one vehicle battery of the electric utility vehicle 12. For example, the subbase frame 24 is configured to be positioned above the frame rails 26 and 28 such that mounting positions for an electric vehicle battery pack are accessible. For example, said battery pack may be mounted between the frame rails, on an internal surface of the frame rails, or on an external surface of the frame rails. Further still, in some embodiments, the battery pack may be disposed directly behind a cab of the electric utility vehicle.

Notification System

Figure 3A:
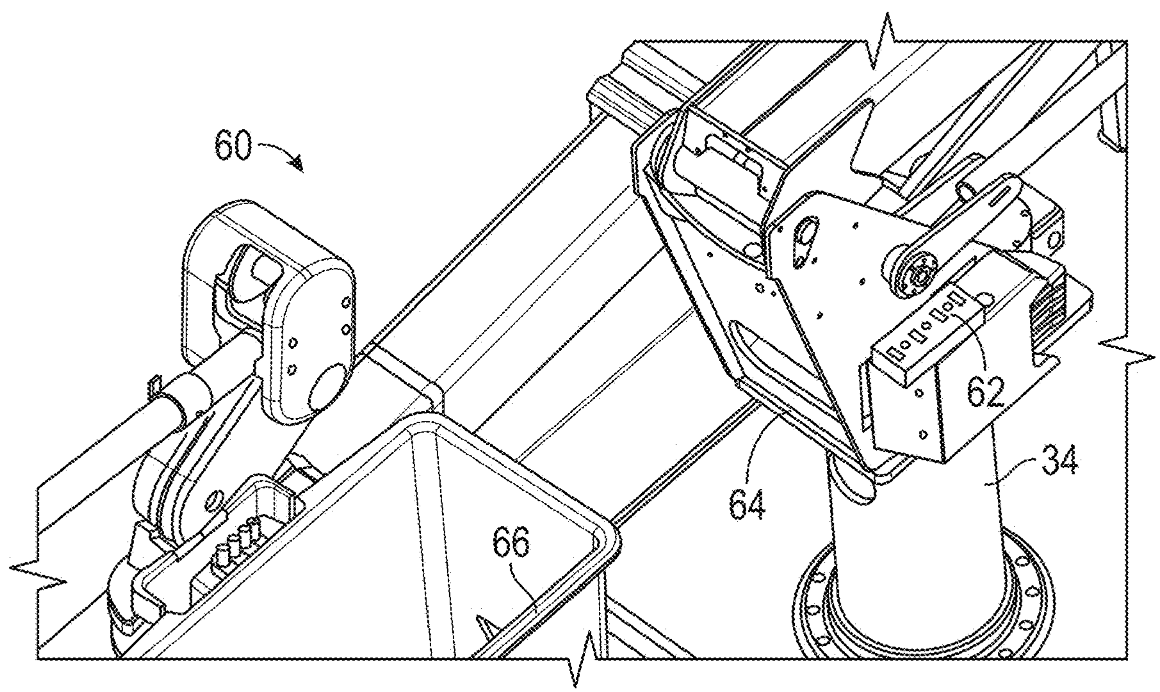
FIG. 3A illustrates an exemplary notification device disposed on a portion of an aerial device coupled to the utility turntable on the subbase assembly relating to some embodiments of the present disclosure.

FIG. 3A illustrates an exemplary notification device disposed on a portion of an aerial device 60 coupled to the utility turntable 34 on the subbase assembly 22 relating to some embodiments of the present disclosure. In some embodiments, the notification device comprises a visual indicator device 62 mounted on a side portion of a base 64 of the aerial device 60. The aerial device 60 may comprise any of, a boom assembly, a crane assembly, a digger derrick assembly, or another suitable form of aerial device or similar utility apparatus. In some embodiments, the aerial device 60 comprises a utility platform 66, as shown. Alternatively, or additionally, in some embodiments, a notification device such as the visual indicator device 62 may be disposed on (or adjacent to the utility platform 66.

Figure 3B:
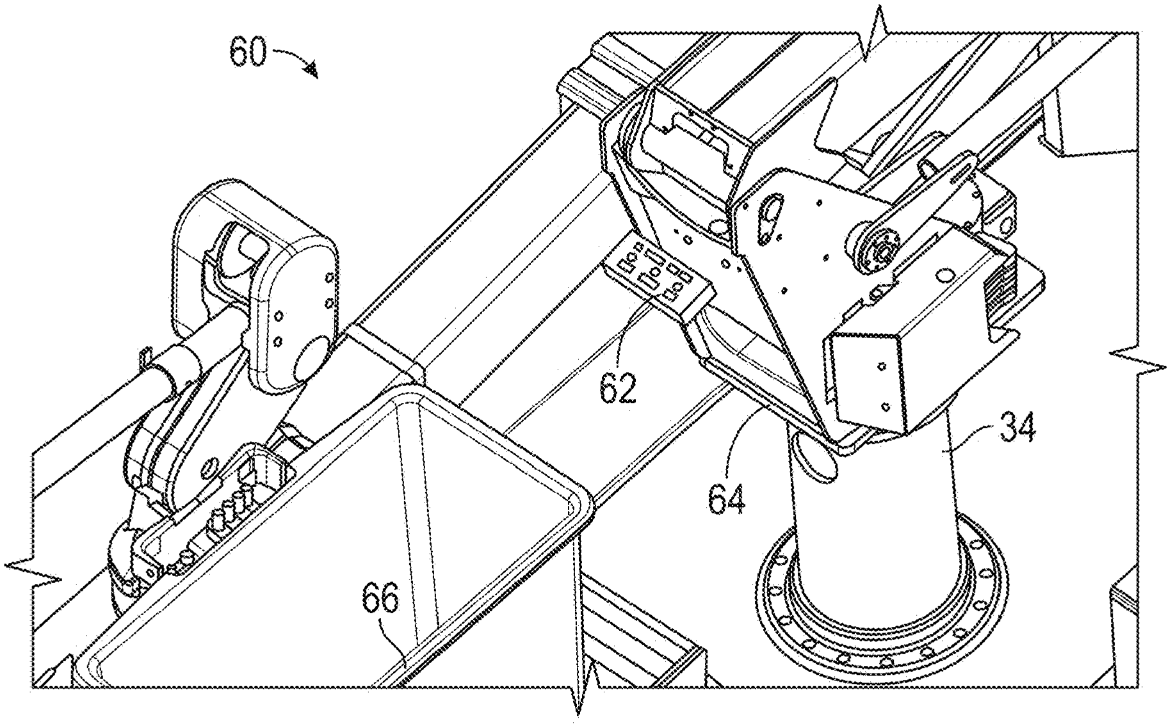
FIG. 3B illustrates another exemplary notification device disposed on a portion of an aerial device coupled to the utility turntable on the subbase assembly relating to some embodiments of the present disclosure.

FIG. 3B illustrates another exemplary notification device disposed on a portion of an aerial device 60 coupled to the utility turntable 34 on the subbase assembly 22 relating to some embodiments of the present disclosure. In some embodiments, the visual indicator device 62 may be mounted on a rear facing surface of the base 64 of the aerial device 60.

Figure 3C:
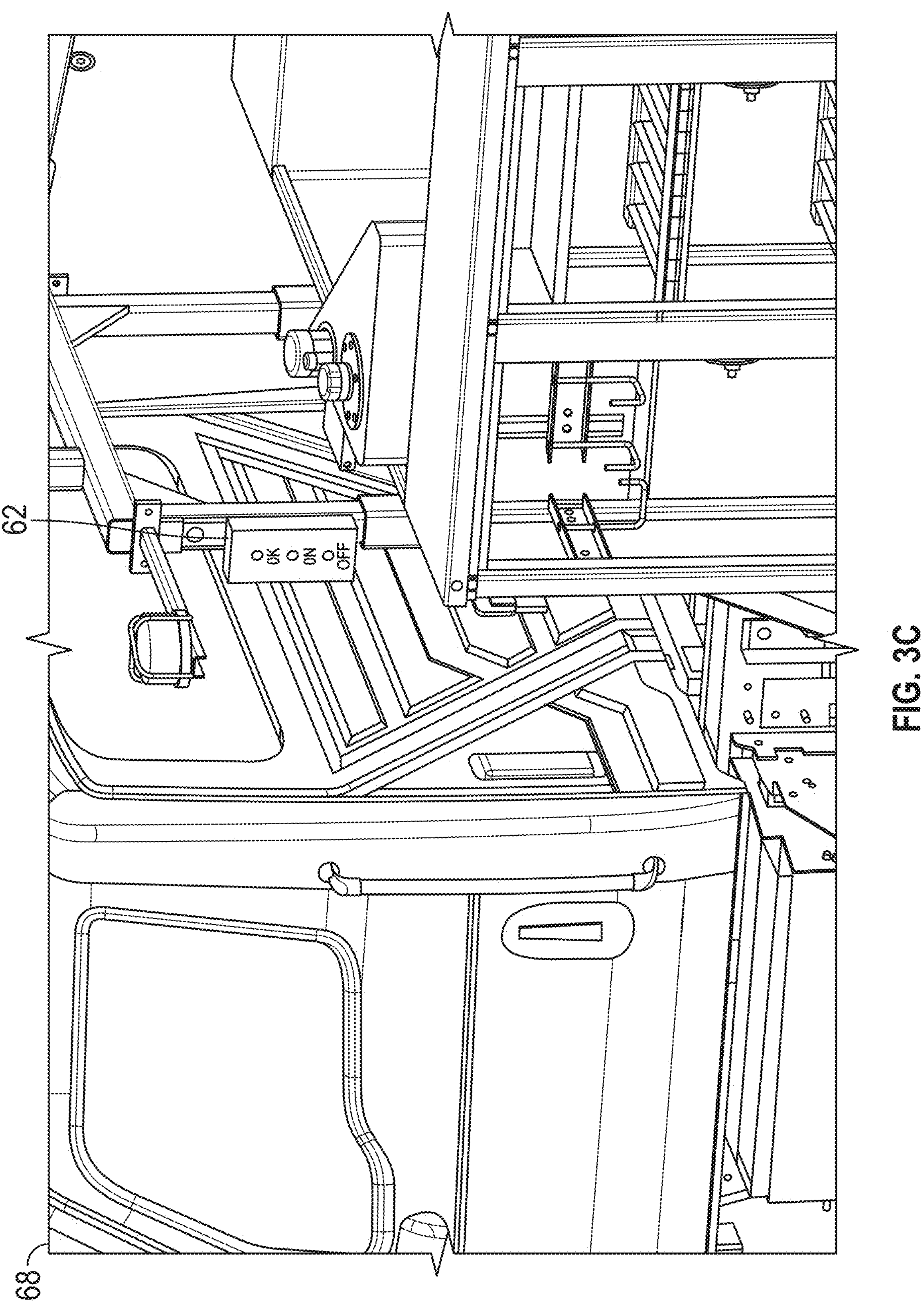
FIG. 3C illustrates another exemplary notification device disposed on a portion of an aerial device coupled to the utility turntable on the subbase assembly relating to some embodiments of the present disclosure.

FIG. 3C illustrates another exemplary notification device disposed on a portion of an aerial device 60 coupled to the utility turntable 34 on the subbase assembly 22 relating to some embodiments of the present disclosure. In some embodiments, the visual indicator device 62 may be mounted on a portion of the subbase 24, such as on a rail or cabinet supported by the subbase 24. In some embodiments, the visual indicator device 62 may be disposed adjacent to a cab 68 of the utility vehicle 12, as shown.

Additionally, or alternatively, embodiments are contemplated in which multiple visual indicator devices 62 may be included. For example, a first visual indicator device may be included mounted to the side of the base 64, a second visual indicator device may be included mounted to the rear side of the base 64, and a third visual indicator device may be included disposed on a portion of the subbase 24.

Figure 4:
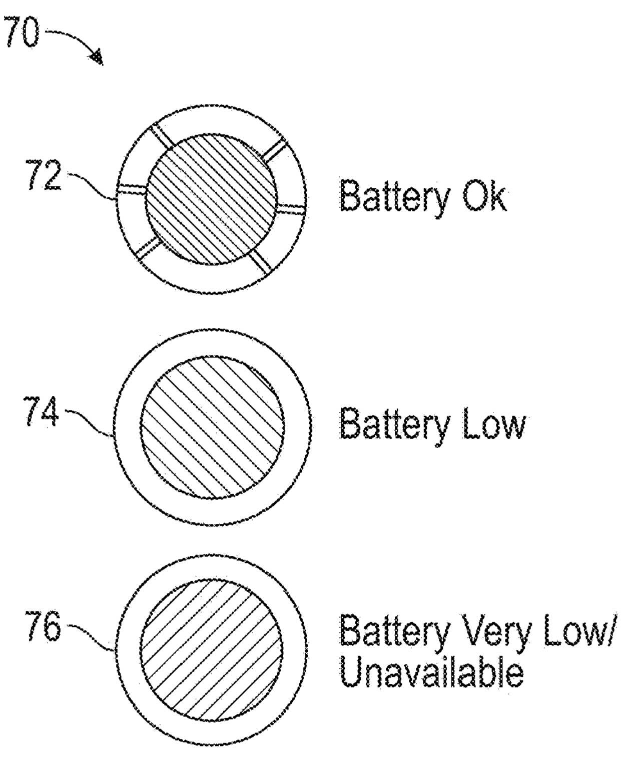
FIG. 4 illustrates an exemplary LED layout for the visual indicator device relating to some embodiments of the present disclosure.

FIG. 4 illustrates an exemplary LED layout 70 for the visual indicator device 62 relating to some embodiments of the present disclosure. In some embodiments, the LED layout 70 comprises a plurality of LEDs such as a first LED 72, a second LED 74, and a third LED 76. In some embodiments, each LED of the plurality of LEDs may be illuminated to convey a different battery level. For example, the first LED 72 may comprise a green LED configured to indicate a suitable or high battery level, the second LED 74 may comprise a yellow LED configured to indicate a low battery level, and the third LED 76 may comprise a red LED configured to indicate a very low battery level or an unavailable battery level.

In some embodiments, further battery levels or other parameters may be indicated by different lighting patterns. For example, in some embodiments, the third LED 76 may be solidly illuminated to indicate a very low battery level and the third LED 76 may be illuminated with a flashing light pattern to indicate an unavailable battery level. Further, in some embodiments, the visual indicator device 62 may be coupled to a backup or other power source besides the vehicle battery such that the visual indicator device 62 may be illuminated even when the vehicle battery is unavailable.

Figure 5:
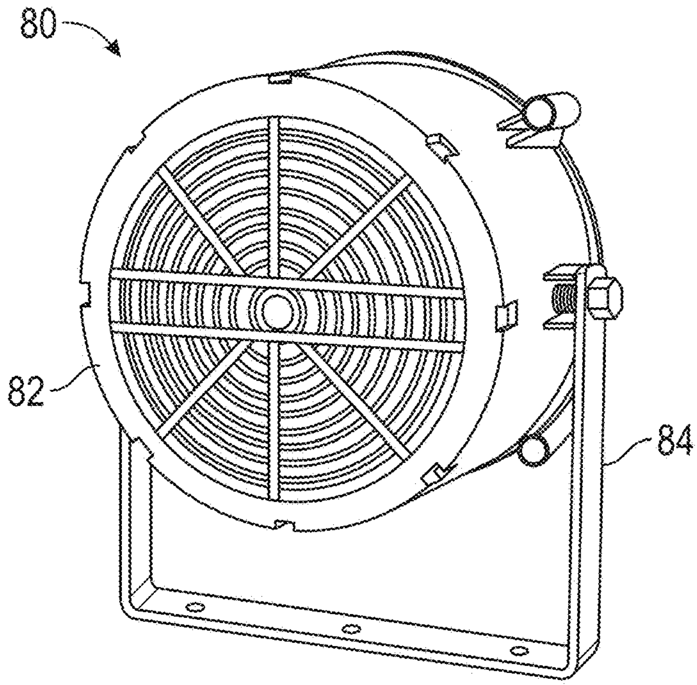
FIG. 5 illustrates an exemplary audible indicator device relating to some embodiments of the present disclosure.

FIG. 5 illustrates an exemplary audible indicator device 80 relating to some embodiments of the present disclosure. The exemplary audible indicator device 80 comprises at least one speaker 82 supported by a support bracket 84, as shown. Alternatively, in some embodiments, other configurations for the exemplary audible indicator device 80 are also contemplated. For example, in some embodiments, the support bracket 84 may not be included and the 80 may be mounted directly to a portion of the utility vehicle 12 or subbase assembly 22. The audible indicator device 80 may be configured to produce an audible notification or alarm responsive to a notification signal. For example, in some embodiments, the audible indicator device 80 may be a Controller Area Network (CAN) enabled device that is coupled to a CAN communication system of the utility vehicle 12. Accordingly, the exemplary audible indicator device 80 may be configured to produce an audible notification responsive to a CAN communication signal received from one or more controllers associated with the utility vehicle 12 or another external notification control system associated with the electric vehicle.

In some embodiments, the audible indicator device 80 is configured to produce different forms of audible alarm based on the battery level. For example, in some embodiments, the audible indicator device 80 may be configured to play prerecorded verbal notification messages including information indicative of a particular battery level. For example, if the current charge battery level is 40%, the audible indicator device 80 may generate an audible message stating that "the current battery level is 40%." Alternatively, the audible indicator device 80 may be configured to indicate the battery level as one of "full", "high", "moderate", "low", "very low", or "unavailable".

Figure 6:
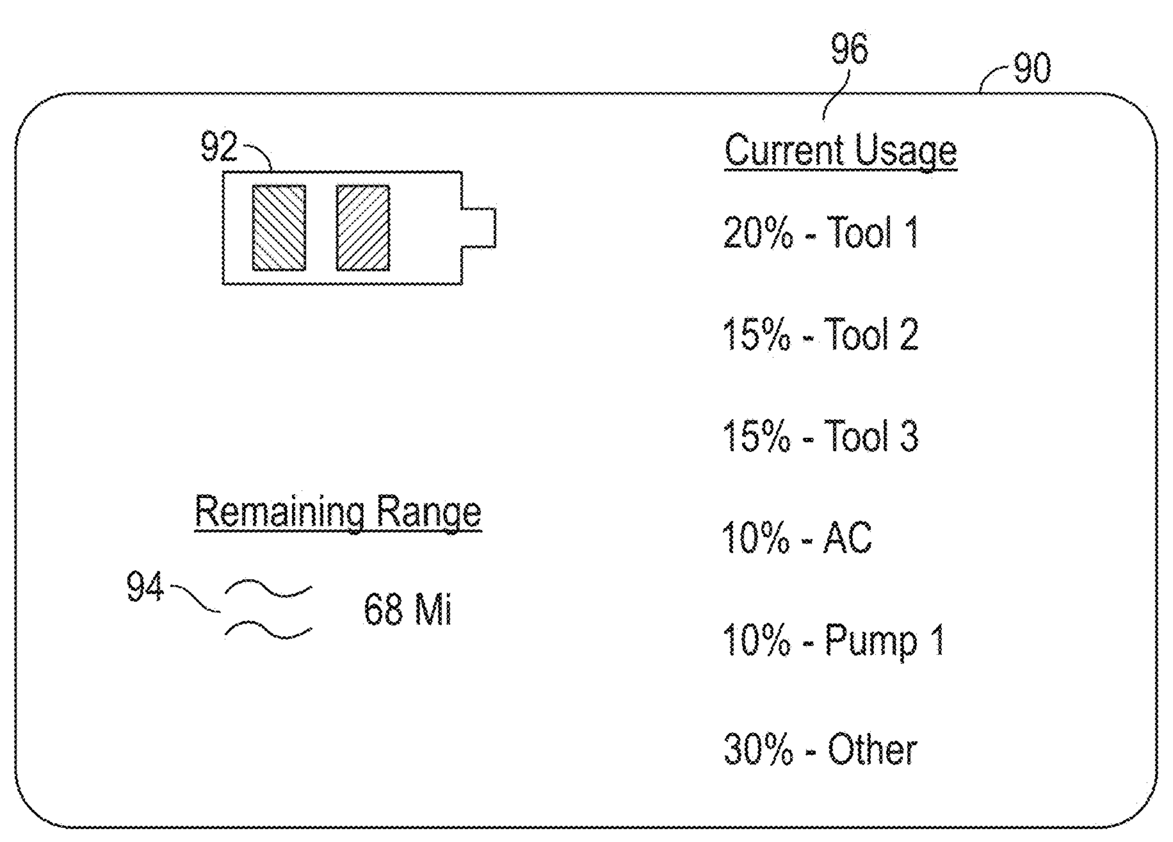
FIG. 6 illustrates an exemplary user interface relating to some embodiments of the present disclosure.

FIG. 6 illustrates an exemplary user interface 90 relating to some embodiments of the present disclosure. The user interface 90 may be generated for display on a computer screen, tablet, smart phone, television screen, a display associated with the electric utility vehicle 12 such as an infotainment system, or another suitable form of display. Further, in some embodiments, the user interface 90 may be generated for display remotely in one or more remote locations that are distinct from the work environment of the electric utility vehicle 12.

In some embodiments, the user interface 90 comprises a battery level indicator 92. In some such embodiments, the battery level indicator 92 comprises a visual representation of the at least one battery and its associated charge level, as shown. Alternatively, or additionally, in some embodiments, the battery level indicator 92 comprises a battery level percentage or other text indicative of the charge level of the at least one battery.

In some embodiments, the user interface 90 comprises a remaining range indicator 94 comprising a range estimation for the vehicle that is determined based at least in part on the battery level. Further, in some embodiments, the user interface 90 comprises a current usage breakdown 96 including a breakdown of the current battery usage. In some such embodiments, the current usage breakdown 96 indicates a percentage of the battery power being used for the vehicle motor, one or more tools, accessories, or other devices coupled to the at least one battery.

In some embodiments, the information included on the user interface 90 may be updated periodically. For example, the information including the battery level indicator 92, remaining range indicator 94, and current usage breakdown 96 may be updated every second, 30 seconds, 1 minute, 5 minutes, 15 minutes, 30 minutes, or another suitable predetermined time period. Alternatively, or additionally, in some embodiments, the information may be updated based on a determined change in the information displayed in the user interface 90. For example, the battery level indicator 92 may be updated responsive to the battery level falling below 5% of the displayed battery level in the battery level indicator 92.

In some embodiments, additional information may be included in the user interface 90. For example, a graph showing the determined battery level over time may be presented on the user interface 90. Accordingly, the operator is able to see the battery usage and discharge over time and may be able to access what types of operation have a significant drain on the battery of the electric utility vehicle.

Control System

Figure 7:
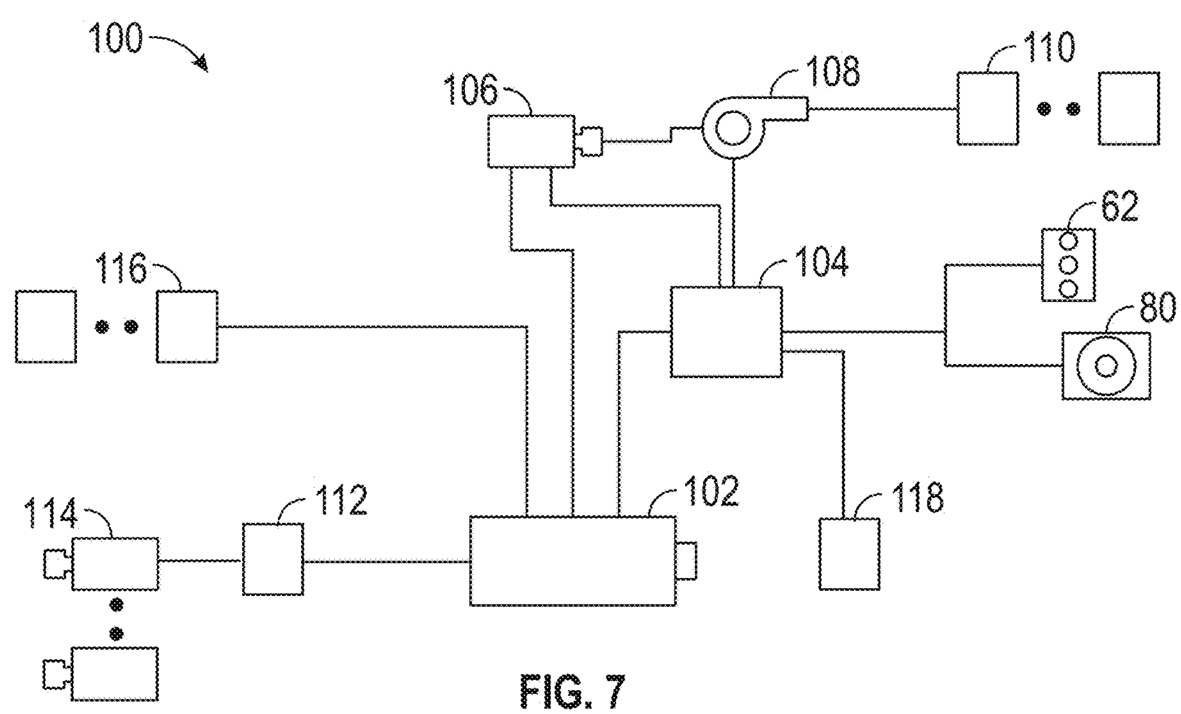
FIG. 7 illustrates a diagram of an exemplary notification and control system 100 relating to some embodiments of the present disclosure.

FIG. 7 illustrates a diagram of an exemplary notification and control system 100 relating to some embodiments of the present disclosure. In some embodiments, the control system 100 may be integrated into the electric utility vehicle 12 as part of the vehicle control system. Alternatively, in some embodiments, the control system 100 may be a separate control system coupled to the vehicle control system. Further still, embodiments are contemplated in which a portion of the control system 100 is integrated directly into the electric utility vehicle 12 while another portion of the control system 100 is separate.

At least one battery 102 may be included, as shown. The at least one battery 102 may comprise an electric vehicle battery of the electric utility vehicle 12 that is configured to provide electrical power to the electric utility vehicle 12 and other auxiliary devices. For example, the at least one battery 102 may comprise a battery pack disposed internally between the frame rails 26 and 28 or disposed externally, such as for example, along an outside surface of one of the frame rails. Alternatively, in some embodiments, one or more separate batteries may be included in addition to or in place of the at least one battery 102. Additionally, it should be understood that one or more other forms of electrical power source are also contemplated, in addition to or in place of the at least one battery 102. For example, in some embodiments, one or more supercapacitors or other form of electrical power are included and configured to perform any of the operations described herein with respect to the at least one battery 102.

The at least one battery 102 may be coupled to a control unit 104, as shown. In some embodiments, the control unit 104 comprises at least one processor configured or programmed to execute one or more non-transitory computer-readable media to perform a processing routine. The control unit 104 may be communicatively coupled and/or electrically coupled to the at least one battery 102. For example, in some embodiments, the control unit 104 may be configured to measure one or more electrical parameters associated with the at least one battery 102. Further, in some embodiments, the control unit 104 receives electrical power from the at least one battery 102. Alternatively, or in addition, the control unit 104 may receive electrical power from a backup power supply or another separate power source distinct from the at least one battery 102. Accordingly, the control unit 104 may be configured to operate during periods of power loss or while power from the at least one battery 102 is unavailable.

The control unit 104 may be coupled to the visual indicator device 62 and the audible indicator device 80, as shown. Accordingly, the control unit 104 may be configured to transmit one or more notification signals for activating the visual indicator device 62 and the audible indicator device 80. In some embodiments, the at least one battery 102 is coupled to an electric power take off (EPTO) 106 of the electric utility vehicle 12. In some embodiments, the EPTO 106 is further communicatively coupled to the control unit 104 such that the control unit 104 is operable to request activation, deactivation, or adjustment of the EPTO 106 in order to monitor and provide electrical power to one or more other devices coupled to the EPTO 106. In some embodiments, the EPTO 106 comprises an inverter and an electric motor configured to convert energy from the battery 102 into mechanical energy for one or more hydraulic devices or other auxiliary devices.

In some embodiments, the EPTO 106 is configured to provide mechanical power to a hydraulic pump 108 or one or more other auxiliary devices. In some embodiments, the at least one battery 102 is configured to provide electrical power for the EPTO 106 and the control unit 104 is configured to control and/or monitor operation of the EPTO 106 and the hydraulic pump 108. The hydraulic pump 108 may be coupled to one or more hydraulic devices 110, as shown, such as, any of a boom cylinder, auger tool, or outrigger cylinders, as well as other forms of hydraulic tools and hydraulic actuators not explicitly described herein. In some embodiments, one or more separate electric motors and hydraulic pumps may be included. Further, in some embodiments, a single pair of electric motor and hydraulic pump may be used to provide hydraulic power to a plurality of hydraulic devices. In some such embodiments, power between the plurality of devices may be controlled and adjusted using one or more hydraulic valves.

In some embodiments, the at least one battery 102 is further coupled to one or more power converters 112 of the vehicle configured to convert electrical energy from the battery 102 for operating one or more vehicle motors 114, such as one or more brushless in-wheel motors disposed within each respective wheel of the electric utility vehicle 12. Additionally, the at least one battery 102 may be coupled to one or more auxiliary electronic devices 116 of the vehicle, such as any of an air conditioning unit, a heating unit, one or more fans, pumps, electrical outlets, or other auxiliary devices coupled to the vehicle.

In some embodiments, the control unit 104 is communicatively coupled to the one or more auxiliary electronic devices 116 such that the control unit 104 is operable to activate and deactivate the one or more auxiliary electronic devices 116 based at least in part on a battery charge level of the at least one battery. Alternatively, in some embodiments, the control unit 104 may be operable to deactivate the one or more auxiliary electronic devices 116 based on one or more other parameters. For example, in some embodiments, the control unit 104 may be configured to deactivate one or more auxiliary electronic devices 116 coupled to the at least one battery 102 based on a determination that an operator is not present within a cab of the electric utility vehicle 12.

In some embodiments, the control unit 104 is further communicatively coupled to a GPS unit 118 of the electric utility vehicle 12, such as for example, a GPS transceiver or GPS receiver. Accordingly, the control unit 104 may access location information associated with the electric utility vehicle 12. For example, in some embodiments, the control unit 104 may consider location information from the GPS unit 118 to determine a vehicle range needed for a return trip of the electric utility vehicle 12. Accordingly, the control unit 104 may determine a vehicle range threshold value operable to cut electrical power or generate a notification based at least in part on the location information.

In some embodiments, any of the components described above and shown in FIG. 7 may be communicatively coupled using a CAN bus system associated with the electric utility vehicle 12. Alternatively, or additionally, one or more other external CAN bus communication systems distinct from the vehicle may be included. Additionally, in some embodiments, one or more other components may be included such as one or more fans, air condition units, heaters, or other auxiliary vehicle components.

Methods of Operation

Figure 8:
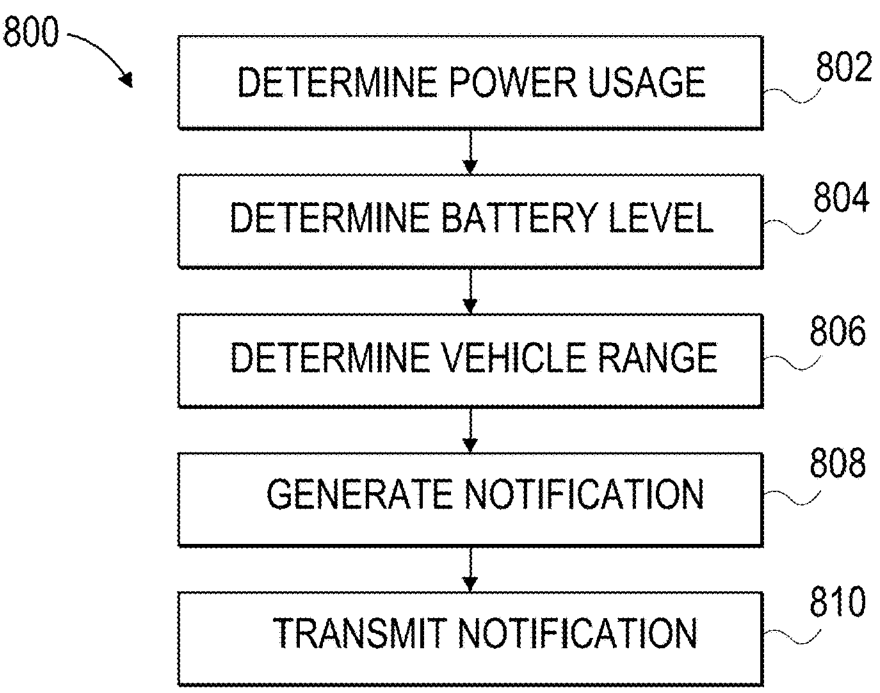
FIG. 8 illustrates an exemplary method of power monitoring and notification for the electric utility vehicle relating to some embodiments of the present disclosure.

FIG. 8 illustrates an exemplary method 800 of power monitoring and notification for the electric utility vehicle 12 relating to some embodiments of the present disclosure. In some embodiments, at least a portion of the method 800 may be performed by one or more processors or control units associated with the electric utility vehicle. For example, in some embodiments, a first portion of steps may be performed by at least one processor of the control unit 104 and a second portion of steps may be performed by at least one processor of a vehicle control system. Alternatively, or additionally, in some embodiments, the method 800 may be performed entirely by the control unit 104.

At step 802, a power usage is determined for the at least one battery 102. In some embodiments, the power usage is determined based at least in part on a signal from a vehicle control system of the electric utility vehicle 12. Alternatively, in some embodiments, the power usage may be determined based on a direct communication connection with the at least one battery 102. Further still, in some embodiments, the power usage may be determined from information associated with one or more electric tools or other electric devices coupled to the battery. For example, the control unit 104 may be communicatively coupled to the one or more electric devices to thereby monitor usage.

At step 804, a battery level is determined for the at least one battery 102. In some embodiments, the battery level may be determined based at least in part on a signal from a vehicle control system of the vehicle.

At step 806, a vehicle range is determined for the electric utility vehicle 12. In some embodiments, the vehicle range may be determined based at least in part on the battery level as determined from step 804. Further, in some embodiments, the vehicle range may be determined based on a variety of other factors associated with the electric utility vehicle 12, such as, for example, a vehicle weight, history of battery use and travel information, location information, and other vehicle related information.

At step 808, a notification is generated. The notification may be generated based at least in part on the battery level and the vehicle range. For example, in some embodiments, the notification comprises a notification signal including information indicative of the battery level and information indicative of the vehicle range.

A variety of different triggering mechanisms for the notification are contemplated. For example, in some embodiments, the notification signal may be generated responsive to detecting a particular battery level or determining that the battery level or the vehicle range have fallen below a predetermined threshold or changed by a particular percentage. Further, in some embodiments, the notification may be generated responsive to receiving a manual operator request. Further still, in some embodiments, the notification may be automatically generated periodically based on a predetermined time period such as, for example, every 15 minutes. Additionally, embodiments are contemplated in which a notification is generated for a particular discharge of the at least one battery. For example, in some embodiments, a battery level notification may be generated for every 5% of discharge of the at least one battery.

At step 810, the notification is transmitted. In some embodiments, transmission of the notification refers to transmission of the notification signal described above through wired, wireless, or another suitable communication means. Execution of the notification may take the form of any of illuminating one or more lights on a visual indicator device 62, producing an audible alarm using the audible indicator device 80, or causing for display of information within the user interface 90, or combinations thereof. It should be understood that the notification signal may be transmitted via any suitable communication technique such as any of a wired connection, a wireless connection, or other suitable communication connection. Further, in some embodiments, the notification may be transmitted remotely. For example, the notification signal may be uploaded to a cloud server via an internet connection and be stored or transmitted elsewhere for alerting one or more remote operators that are not in the immediate work environment.

It should be understood that the notification devices described herein may be disposed in a variety of locations. For example, embodiments are contemplated in which one or more of the visual indicator device 62, the audible indicator device 80, and a display configured to display the user interface 90 are disposed on or adjacent to a utility platform 66 of the aerial device 60 such that the notification is presented and available to an operator positioned in the utility platform 66. In some such embodiments, at least a portion of the aerial device 60 may be electrically bonded to an energized power line, for example, to perform maintenance or other operations on a live powerline. Accordingly, the notification may be transmitted via a non-electrically wired means such as a wireless connection such as, radio signals, a wireless network connection, or a non-electrical wired connection such as a fiber optic cable disposed across a dielectric gap of the aerial device 60 such that the notification signal may be transmitted across the dielectric gap without interfering with the electrical bonding or electrically grounding the bonded portion of the aerial device 60.

In some embodiments, the notification may be transmitted to one or more operators, during operation of the aerial device 60 and/or one or more other devices coupled the electric utility vehicle 12. For example, the notification may be transmitted to an operator positioned on the utility platform 66 such that the operator is alerted while performing work in the utility platform 66. Said notification may be transmitted while the electric utility vehicle 12 is parked and/or powered down.

Figure 9:
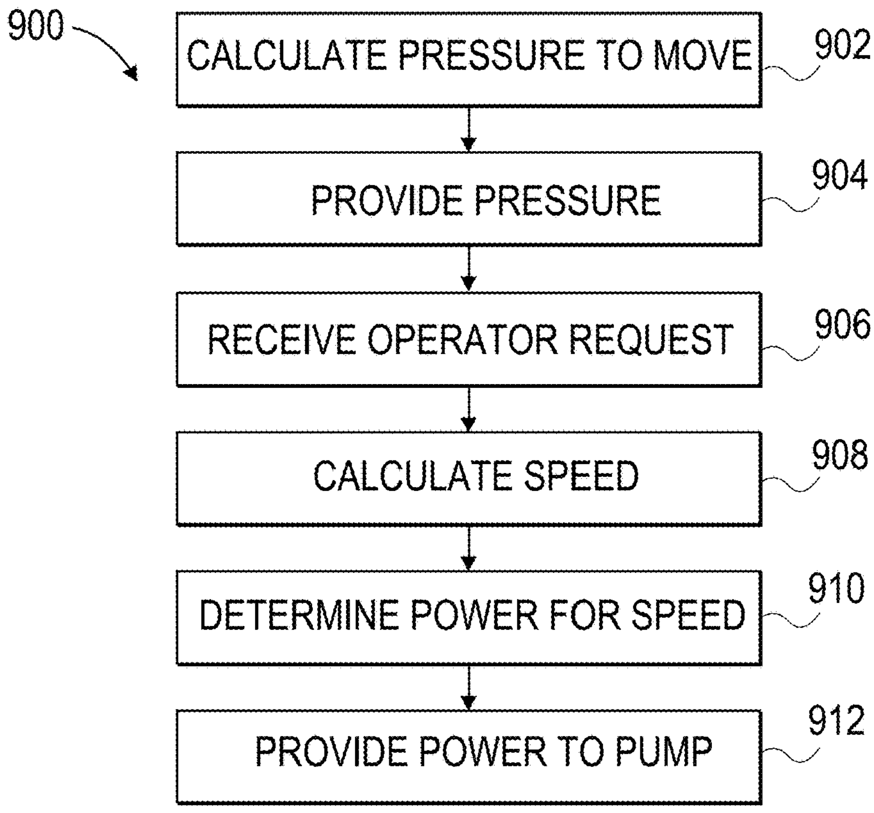
FIG. 9 illustrates an exemplary method of operating a hydraulic system coupled to the electric utility vehicle.

FIG. 9 illustrates an exemplary method 900 of operating a hydraulic system coupled to the electric utility vehicle 12. In some embodiments, the method 900 may be performed at least partially by the control unit 104. For example, the control unit 104 may be communicatively coupled to the hydraulic system to thereby control and monitor operation of the hydraulic system.

At step 902, a pressure to move for at least a portion of the hydraulic system is calculated. For example, the pressure to move may refer to a pressure within a hydraulic line of the hydraulic system configured to provide movement or action to one or more hydraulic devices. Accordingly, based on a compressibility of a hydraulic fluid within the hydraulic line and/or a change in length of the hydraulic line, for example, from an extension or retraction of a telescoping boom of the aerial device 60, the amount of pressure to provide movement to the hydraulic device may be variable. In typical hydraulic systems, said variability in the pressure to move causes a reduction in response time associated with building up pressure to accommodate said variation in pressure to move. The pressure to move may be calculated using an algorithm executed by the control unit 104. For example, said algorithm may be operable to calculate a pressure to move based at least in part on a real-time measurement of a current pressure in the hydraulic system and/or other parameters associated with the hydraulic system, such as any of a boom extension status, a temperature, a fluid compressibility, combinations thereof, or one or more other suitable parameters.

At step 904, a pressure is provided to the hydraulic line based on the calculated pressure to move from step 902. For example, the control unit 104 may request a pressure increase from the EPTO 106 such that the hydraulic pump 108 increases the pressure in the hydraulic line to the calculated pressure to move such that the hydraulic device is able to move or perform an action immediately once an operator request or automatic request is received. In some embodiments, the pressure to move is calculated and the pressure is provided prior to receiving a request to move or operate the hydraulic device. Accordingly, the pressure to move is maintained in the hydraulic line over time and the hydraulic device is ready to move whenever a request is received. As such, the response time of the hydraulic system is improved and the hydraulic lag is removed.

At step 906, an operator request is received. The operator request may comprise an operator input into an input device such as an input device of the hydraulic system. Alternatively, in some embodiments, the operator request may be received remotely from a remote operator in a distinct location from the utility vehicle 12. Further, the operator request may comprise an automated request such as for example, a scheduled request or a request received from at least one processor. The operator request may include a request to move, or otherwise activate one or more hydraulic devices of the hydraulic system. In some embodiments, the operator request includes a requested speed or power level for the hydraulic device.

At step 908, a speed is calculated for the hydraulic system based on the operator request. For example, a requested speed for one or more hydraulic devices may be determined from the operator request. At step 910, a power is determined for the requested speed. For example, the power level may be an electric power value associated with providing the requested speed of the hydraulic device.

At step 912, electrical power is provided to one or more hydraulic pumps responsive to the operator request. The electrical power may be provided at the determined value of step 910 such that the hydraulic device operates at the requested speed. For example, the hydraulic system may comprise the EPTO 106 coupled to the hydraulic pump 108 and coupled to one or more hydraulic devices, such as a digger derrick auger, a hydraulic motor, or other hydraulic actuator and the electrical power is provided to the EPTO 106 such that the hydraulic device is activated at the requested speed.

Further, it should be understood that the initial steps of calculating the pressure to move and providing the pressure allows the hydraulic system to respond immediately to the operator request.

Figure 10A:
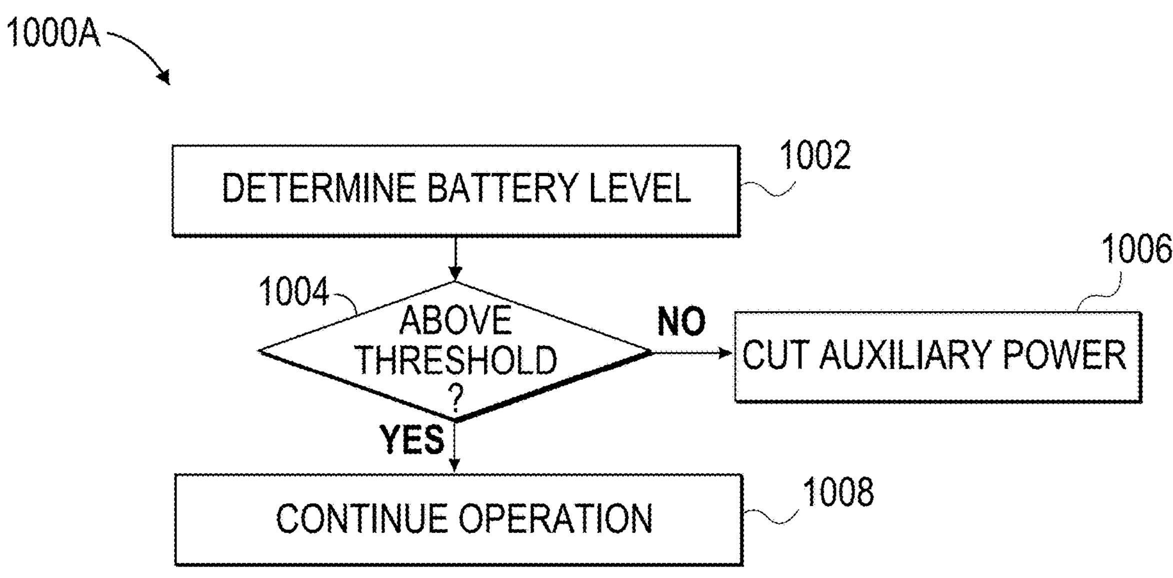
FIG. 10A illustrates an exemplary flow diagram for battery monitoring relating to some embodiments of the present disclosure.

FIG. 10A illustrates an exemplary flow diagram 1000A for battery monitoring relating to some embodiments of the present disclosure. The steps described herein with respect to the flow diagram 1000A may be performed, for example, by the control unit 104.

At step 1002, a battery level is determined for the at least one battery 102. In some embodiments, the battery level may be determined based on a vehicle communication signal, for example, received from the CAN bus of the electric utility vehicle 12. Alternatively, or additionally, in some embodiments, the battery level may be determined directly by an electrical connection to the at least one battery 102.

At step 1004, it is determined whether the battery level is above a predetermined threshold. If the battery level is not above the threshold, electrical power to one or more auxiliary devices is disabled at step 1006. For example, if the battery level is below the predetermined threshold the auxiliary devices may be disconnected to prevent further drain of the at least one battery 102. Further, in some embodiments, other operations may be performed based on the battery level being below the predetermined threshold. For example, in some embodiments, a battery level notification may be generated and transmitted based on the battery level being below the predetermined threshold. Further still, in some embodiments, auxiliary power may be disabled based on a determination that the remaining vehicle range has fallen below a particular threshold, such as a vehicle range threshold associated with a return trip of the electric utility vehicle 12.

At step 1008, if the battery level is above the predetermined threshold, operation is continued. The battery level determination and comparison to the threshold may be repeated any number of times. For example, in some embodiments, the steps of the flow diagram 1000A may be repeated periodically, for example, based on a predetermined time period.

Figure 10B:
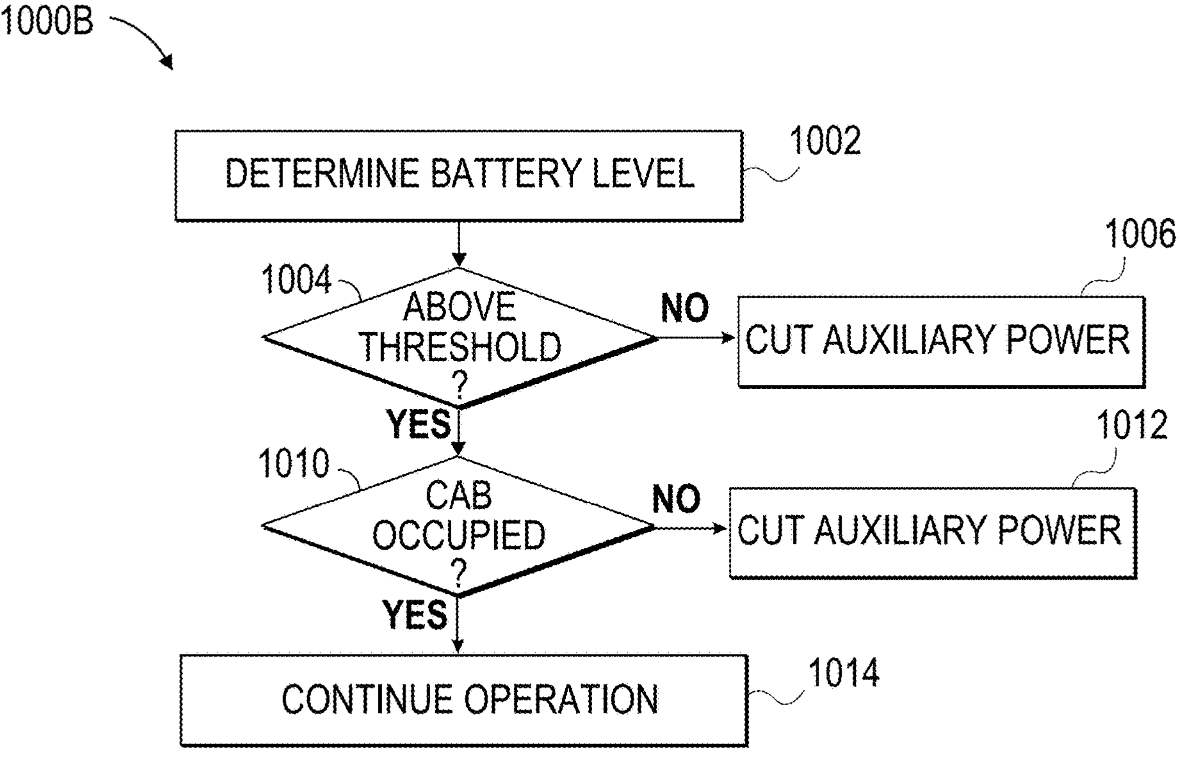
FIG. 10B illustrates an exemplary flow diagram for battery monitoring relating to some embodiments of the present disclosure.

FIG. 10B illustrates an exemplary flow diagram 1000B for battery monitoring relating to some embodiments of the present disclosure. Similar to the flow diagram 1000A, as described above, the steps described herein with respect to the flow diagram 1000B may be performed, for example, by the control unit 104.

At step 1002, a battery level is determined for the at least one battery 102. In some embodiments, the battery level may be determined based on a vehicle communication signal, for example, received from the CAN bus of the electric utility vehicle 12. Alternatively, or additionally, in some embodiments, the battery level may be determined directly by an electrical connection to the at least one battery 102.

At step 1004, it is determined whether the battery level is above a predetermined threshold. If the battery level is not above the threshold, electrical power to one or more auxiliary devices is disabled at step 1006. For example, if the battery level is below the predetermined threshold the auxiliary devices may be disconnected to prevent further drain of the at least one battery 102. Further, in some embodiments, other operations may be performed based on the battery level being below the predetermined threshold. For example, in some embodiments, a battery level notification may be generated and transmitted based on the battery level being below the predetermined threshold. Further still, in some embodiments, auxiliary power may be disabled based on a determination that the remaining vehicle range has fallen below a particular threshold, such as a vehicle range threshold associated with a return trip of the electric utility vehicle 12.

At step 1010, it is determined whether the cab of the electric utility vehicle 12 is currently occupied. Said determination may be based, for example, on one or more presence sensors disposed within the cab. If the cab is not occupied, electrical power to one or more auxiliary devices is disabled at step 1012. For example, electrical power may be disconnected for one or more devices disposed in the cab, such as, an AC unit, heater, fan, or other auxiliary vehicle equipment.

At step 1014, if the cab is occupied and the battery level is above the predetermined threshold, operation may continue. For example, the one or more auxiliary electrical devices disposed in the cab may continue to operate. Accordingly, the auxiliary electrical power is not wasted when an operator is not present or when the battery level is low, but is continued while the operator is present.

It should be understood that a variety of other steps may be included, for example, to increase an energy efficiency of the electric utility vehicle 12 based on the battery level and operator presence. Further, it should be understood that further structural modifications may be made to increase the energy efficiency. For example, any portion of the subbase assembly 22 or other parts of the electric utility vehicle 12 may be reduced in size or configured to fit within the width of the utility vehicle 12, when stowed, to improve the aerodynamic profile of the electric utility vehicle 12 and thereby increase the travel efficiency and battery efficiency of the electric utility vehicle 12. For example, structures may be prevented from protruding outward from the utility vehicle 12, while stowed, as to not interfere with aerodynamics during travel.

Although the present disclosure has been described with reference to the embodiments illustrated in the attached drawing figures, it is noted that equivalents may be employed and substitutions made herein without departing from the scope of the present disclosure as recited in the claims. Having thus described various embodiments of the present disclosure, what is claimed as new and desired to be protected by Letters Patent includes the following:

The invention claimed is:

1. A method of notification for an electric utility vehicle, the method comprising:

receiving at least one signal from a vehicle system of the electric utility vehicle;

identifying a vehicle range based at least in part on a battery level of the electric utility vehicle from the at least one signal from the vehicle system;

generating at least one notification signal comprising information indicative of the vehicle range; and transmitting the at least one notification signal to an indicator device that is external to a cab of the electric utility vehicle such that a notification comprising the information indicative of the vehicle range is communicated to an operator external to the cab of the electric utility vehicle by the indicator device.

2. The method of claim 1, further comprising:

identifying a battery level associated with the electric utility vehicle based at least in part on the at least one signal from the vehicle system.

3. The method of claim 2, wherein the at least one notification signal further comprises information indicative of the battery level such that the information indicative of the battery level is communicated to the operator external to the cab of the electric utility vehicle.

4. The method of claim 2, further comprising:

responsive to determining that the battery level associated with the electric utility vehicle is below a predetermined threshold, disabling operation of one or more auxiliary electrical devices coupled to the electric utility vehicle.

5. The method of claim 1, further comprising:

responsive to determining that an operator is not present within a cab of the electric utility vehicle, disabling one or more electronic devices disposed in the cab of the electric utility vehicle.

6. The method of claim 1, further comprising:

determining a power usage based at least in part on a power level of one or more external electrical devices coupled to at least one battery of the electric utility vehicle.

7. The method of claim 1, wherein the at least one notification signal is transmitted while the electric utility vehicle is parked.

8. A notification system for an electric utility vehicle, the notification system comprising:

at least one indicator device coupled to an external portion of the electric utility vehicle external to a cab of the electric utility vehicle;

a control system communicatively coupled to a vehicle system of the electric utility vehicle, the control system comprising at least one processor and one or more non-transitory computer-readable media that store computer-executable instructions that, when executed by the at least one processor, perform a method of notification, the method comprising:

receiving at least one signal from the vehicle system of the electric utility vehicle;

identifying a battery level associated with the electric utility vehicle based at least in part on the at least one signal from the vehicle system;

generating at least one notification signal comprising information indicative of the battery level; and transmitting the at least one notification signal to the at least one indicator device that is external to a cab of the electric utility vehicle such that a notification comprising the information indicative of the battery level is communicated to an operator external to the cab of the electric utility vehicle by the at least one indicator device.

9. The notification system of claim 8, the method further comprising:

identifying a vehicle range based at least in part on the battery level of the electric utility vehicle from the at least one signal from the vehicle system.

10. The notification system of claim 9, wherein the at least one notification signal further comprises information indicative of the vehicle range such that the information indicative of the vehicle range is communicated to the operator external to the cab of the electric utility vehicle.

11. The notification system of claim 8, wherein the at least one indicator device comprises a visual indicator device.

12. The notification system of claim 11, wherein the visual indicator device comprises a plurality of light emitting diodes that are selectively illuminated responsive to the at least one notification signal.

13. The notification system of claim 8, wherein the at least one indicator device comprises an audible indicator device operable to audibly communicate the information indicative of the battery level to the operator external to the cab of the electric utility vehicle.

14. The notification system of claim 13, wherein the audible indicator device comprises one or more speakers disposed on an exterior of the electric utility vehicle.

15. One or more non-transitory computer-readable media that store computer-executable instructions that, when executed by at least one processor, perform a method of notification for an electric utility vehicle, the method comprising:

receiving at least one signal from a vehicle system of the electric utility vehicle;

identifying a vehicle range based at least in part on a battery level of the electric utility vehicle from the at least one signal from the vehicle system;

generating at least one notification signal comprising information indicative of the vehicle range; and transmitting the at least one notification signal to an indicator device that is external to a cab of the electric utility vehicle such that a notification comprising the information indicative of the vehicle range is communicated to an operator external to the cab of the electric utility vehicle by the indicator device.

16. The one or more non-transitory computer-readable media of claim 15, the method further comprising:

causing for display, within a user interface associated with the electric utility vehicle, an indication of a current usage of at least one battery of the electric utility vehicle.

17. The one or more non-transitory computer-readable media of claim 15, the method further comprising:

causing for display, within a user interface associated with the electric utility vehicle, an indication of the vehicle range.

18. The one or more non-transitory computer-readable media of claim 15, the method further comprising:

causing for display, within a user interface associated with the electric utility vehicle, an indication of the battery level.

19. The one or more non-transitory computer-readable media of claim 15, the method further comprising:

receiving location data from a GPS device associated with the electric utility vehicle; and determining a return range associated with a return location of the electric utility vehicle based at least in part on the location data.

20. The one or more non-transitory computer-readable media of claim 19, the method further comprising:

responsive to a comparison of the vehicle range and the return range, generating a return range notification including information indicative of the vehicle range relative to the return range.

* * * * *